(12) United States Patent
Tu et al.

(10) Patent No.: US 12,096,661 B2
(45) Date of Patent: Sep. 17, 2024

(54) OLED DISPLAY PANEL AND OLED DISPLAY DEVICE

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventors: Zeyi Tu, Hubei (CN); Yu Gu, Hubei (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/413,661

(22) PCT Filed: Jun. 3, 2021

(86) PCT No.: PCT/CN2021/098048
§ 371 (c)(1),
(2) Date: Jun. 24, 2021

(87) PCT Pub. No.: WO2022/241853
PCT Pub. Date: Nov. 24, 2022

(65) Prior Publication Data
US 2024/0251600 A1  Jul. 25, 2024

(30) Foreign Application Priority Data

May 21, 2021  (CN) .......................... 202110558275.7

(51) Int. Cl.
*H10K 59/122* (2023.01)

(52) U.S. Cl.
CPC ................................. *H10K 59/122* (2023.02)

(58) Field of Classification Search
None
See application file for complete search history.

(56) References Cited

U.S. PATENT DOCUMENTS

| 2014/0110701 A1* | 4/2014 | Noh ...................... H10K 59/122 |
| | | 438/35 |
| 2019/0237524 A1* | 8/2019 | Chen .................. H10K 50/8428 |
| 2021/0066415 A1 | 3/2021 | Lee et al. |
| 2022/0310705 A1* | 9/2022 | Chen ...................... H10K 50/11 |

FOREIGN PATENT DOCUMENTS

| CN | 108400146 | 8/2018 |
| CN | 109343263 | 2/2019 |
| CN | 109786578 | 5/2019 |

(Continued)

*Primary Examiner* — Michelle Mandala

(57) ABSTRACT

An OLED display panel and an OLED display device are disclosed. In the OLED display panel, a ratio of a width of a side of a first pixel opening adjacent to a pixel electrode layer to a length of a lateral surface of the first pixel opening is greater than a ratio of a width of a side of a second pixel opening adjacent to the pixel electrode layer to a length of a lateral surface of the second pixel opening, such that the nonuniform brightness between a first display area and a second display area is improved or even eliminated.

20 Claims, 4 Drawing Sheets

(56) References Cited

FOREIGN PATENT DOCUMENTS

| | | |
|---|---|---|
| CN | 110112200 | 8/2019 |
| CN | 110993675 | 4/2020 |
| CN | 111146362 | 5/2020 |
| CN | 111384095 | 7/2020 |
| CN | 111554727 | 8/2020 |
| CN | 111599938 | 8/2020 |
| CN | 111613655 | 9/2020 |
| CN | 211980618 | 11/2020 |
| CN | 112072000 | 12/2020 |
| JP | 2006-293344 | 10/2006 |

\* cited by examiner

OLED DISPLAY PANEL AND OLED DISPLAY DEVICE

RELATED APPLICATIONS

This application is a National Phase of PCT Patent Application No. PCT/CN2021/098048 having International filing date of Jun. 3, 2021, which claims the benefit of priority of Chinese Patent Application No. 202110558275.7 filed on May 21, 2021. The contents of the above applications are all incorporated by reference as if fully set forth herein in their entirety.

FIELD AND BACKGROUND OF THE INVENTION

The present disclosure relates to the field of display technology, and more particularly, to an OLED display panel and an OLED display device.

Organic light-emitting diode (OLED) displays are widely used because of its flexibility, wide viewing angles and high color gamuts. In order to enhance the brightness and the color gamut of the OLED display devices at the front viewing angle, Fabry-Perot design may be adopted for the OLED display devices. However, this design may decrease the brightness of the OLED display device rapidly with the increase of the viewing angle.

In order to improve the screen-to-body ratio of the existing display device, a camera may be disposed under the display. Since the components with the light-shielding function are removed in the area of the under-display camera, the brightness attenuation in the area of the under-display camera is slower than that in other areas with the increase of the viewing angle, which results in nonuniform brightness of the OLED display device.

Therefore, the existing OLED display device has the technical problem that the brightness attenuation in the area of the under-display camera is slower than that in other areas with the increase of the viewing angle, which results in nonuniform brightness of the OLED display device.

SUMMARY OF THE INVENTION

Technical Problem

An OLED display panel and an OLED display device are provided in embodiments of the present disclosure to solve the technical problem that an existing OLED display device has nonuniform brightness caused by different brightness attenuation rates in different areas with the variation of the viewing angle.

Technical Solutions

In order to solve the aforementioned problem, the technical solutions provided by the present disclosure are as follow:

In embodiments of the present disclosure, an OLED display panel is disclosed, including a first display area and a second display are, wherein the OLED display panel includes:

a substrate;
a driving circuit layer disposed on a side of the substrate;
a pixel electrode layer disposed on a side of the driving circuit layer away from the substrate;
a pixel definition layer disposed on a side of the pixel electrode layer away from the driving circuit layer, wherein a first pixel opening in the first display area and a second pixel opening in the second display area are formed by the pixel definition layer;
a light-emitting layer disposed on a side of the pixel definition layer away from the pixel electrode layer;
a common electrode layer disposed on a side of the light-emitting layer away from the pixel definition layer;
wherein a ratio of a width of a side of the first pixel opening adjacent to the pixel electrode layer to a length of a lateral surface of the first pixel opening is greater than a ratio of a width of a side of the second pixel opening adjacent to the pixel electrode layer to a length of a lateral surface of the second pixel opening.

In some embodiments, the length of the lateral surface of the first pixel opening is smaller than the length of the lateral surface of the second pixel opening, and an angle between the lateral surface of the first pixel opening and the side of the first pixel opening adjacent to the pixel electrode layer is equal to an angle between the lateral surface of the second pixel opening and the side of the second pixel opening adjacent to the pixel electrode layer.

In some embodiments, each of the first pixel opening and the second pixel opening includes four lateral surfaces surrounding the light-emitting layer, and a length of any one of the lateral surfaces of the first pixel opening is smaller than a length of corresponding one of the lateral surfaces of the second pixel opening.

In some embodiments, the width of the side of the first pixel opening adjacent to the pixel electrode layer is greater than or equal to the width of the side of the second pixel opening adjacent to the pixel electrode layer.

In some embodiments, the width of the side of the first pixel opening adjacent to the pixel electrode layer is smaller than the width of the side of the second pixel opening adjacent to the pixel electrode layer.

In some embodiments, the OLED display panel further includes a packaging layer, and a thickness of the packaging layer located on the first pixel opening is greater than a thickness of the packaging layer located on the second pixel opening.

In some embodiments, the length of the lateral surface of the first pixel opening is equal to the length of the lateral surface of the second pixel opening, and the width of the side of the first pixel opening adjacent to the pixel electrode layer is greater than the width of the side of the second pixel opening adjacent to the pixel electrode layer.

In some embodiments, the length of the lateral surface of the first pixel opening is greater than the length of the lateral surface of the second pixel opening, and the width of the side of the first pixel opening adjacent to the pixel electrode layer is greater than the width of the side of the second pixel opening adjacent to the pixel electrode layer.

In some embodiments, the ratio of the width of the side of the first pixel opening adjacent to the pixel electrode layer to the length of the lateral surface of the first pixel opening is 1.1 to 4 times of the ratio of the width of the side of the second pixel opening adjacent to the pixel electrode layer to the length of the lateral surface of the second pixel opening.

Moreover, in embodiments of the present disclosure, an OLED display device is disclosed, which includes:

an OLED display panel including a first display area and a second display area, wherein the OLED display panel includes a substrate, a driving circuit layer, a pixel electrode layer, a pixel definition layer, a light-emitting layer, and a common electrode layer, the driving circuit layer is disposed on a side of the substrate, the pixel electrode layer is disposed on a side of the driving circuit layer away from the substrate, the pixel definition layer is disposed on a side of the pixel electrode layer away from the driving circuit layer, a first pixel opening in the first display area and a second pixel opening in the second display area are formed by the pixel definition layer, the light-emitting layer is disposed on a side of the pixel definition layer away from the pixel electrode layer, the common electrode layer is disposed on a side of the light-emitting layer away from the pixel definition layer, wherein a ratio of a width of a side of the first pixel opening adjacent to the pixel electrode layer to a length of a lateral surface of the first pixel opening is greater than a ratio of a width of a side of the second pixel opening adjacent to the pixel electrode layer to a length of a lateral surface of the second pixel opening; and an electronic element disposed in the first display area.

In some embodiments, the electronic element includes an under-display camera.

In some embodiments, the length of the lateral surface of the first pixel opening is smaller than the length of the lateral surface of the second pixel opening, and an angle between the lateral surface of the first pixel opening and the side of the first pixel opening adjacent to the pixel electrode layer is equal to an angle between the lateral surface of the second pixel opening and the side of the second pixel opening adjacent to the pixel electrode layer.

In some embodiments, each of the first pixel opening and the second pixel opening includes four lateral surfaces surrounding the light-emitting layer, and a length of any one of the lateral surfaces of the first pixel opening is smaller than a length of corresponding one of the lateral surfaces of the second pixel opening.

In some embodiments, the width of the side of the first pixel opening adjacent to the pixel electrode layer is greater than or equal to the width of the side of the second pixel opening adjacent to the pixel electrode layer.

In some embodiments, the width of the side of the first pixel opening adjacent to the pixel electrode layer is smaller than the width of the side of the second pixel opening adjacent to the pixel electrode layer.

In some embodiments, the OLED display panel further includes a packaging layer, and a thickness of the packaging layer located on the first pixel opening is greater than a thickness of the packaging layer located on the second pixel opening.

In some embodiments, a thickness of the common electrode layer located on the first pixel opening is greater than a thickness of the common electrode layer located on the second pixel opening.

In some embodiments, the length of the lateral surface of the first pixel opening is equal to the length of the lateral surface of the second pixel opening, and the width of the side of the first pixel opening adjacent to the pixel electrode layer is greater than the width of the side of the second pixel opening adjacent to the pixel electrode layer.

In some embodiments, the length of the lateral surface of the first pixel opening is greater than the length of the lateral surface of the second pixel opening, and the width of the side of the first pixel opening adjacent to the pixel electrode layer is greater than the width of the side of the second pixel opening adjacent to the pixel electrode layer.

In some embodiments, the ratio of the width of the side of the first pixel opening adjacent to the pixel electrode layer to the length of the lateral surface of the first pixel opening is 1.1 to 4 times of the ratio of the width of the side of the second pixel opening adjacent to the pixel electrode layer to the length of the lateral surface of the second pixel opening.

Beneficial Effect

An OLED display panel and an OLED display device are disclosed in the present disclosure. The OLED display panel includes a first display area and a second display area. The OLED display panel includes a substrate, a driving circuit layer, a pixel electrode layer, a pixel definition layer, a light-emitting layer, and a common electrode layer. The driving circuit layer is disposed on a side of the substrate. The pixel electrode layer is disposed on a side of the driving circuit layer away from the substrate. The pixel definition layer is disposed on a side of the pixel electrode layer away from the driving circuit layer. A first pixel opening in the first display area and a second pixel opening in the second display area are formed by the pixel definition layer. The light-emitting layer is disposed on a side of the pixel definition layer away from the pixel electrode layer. The common electrode layer is disposed on a side of the light-emitting layer away from the pixel definition layer. A ratio of a width of a side of the first pixel opening adjacent to the pixel electrode layer to a length of a lateral surface of the first pixel opening is greater than a ratio of a width of a side of the second pixel opening adjacent to the pixel electrode layer to a length of a lateral surface of the second pixel opening. In other words, the rate of the brightness attenuation in the first display area caused by the increased viewing angle is enhanced, and/or the rate of the brightness attenuation in the second display area caused by the increased viewing angle is reduced, such that the brightness attenuations in the first and second display areas caused by the increased viewing angle are close or even the same, thereby improving or even eliminating the nonuniform brightness between the first display area and the second display area.

BRIEF DESCRIPTION OF THE SEVERAL VIEWS OF THE DRAWINGS

The technical solutions and other beneficial effects of the present disclosure may be obvious through the detailed description of the specific embodiments of the present disclosure with reference made to the accompanying drawings as follow.

DESCRIPTION OF SPECIFIC EMBODIMENTS OF THE INVENTION

The technical solutions in the embodiments of the present disclosure are hereinafter described clearly and in detail with reference to the accompanying drawings. Obviously, the described embodiments are only some embodiments rather than all embodiments of the present disclosure. All the other embodiments which could be obtained by those skilled in the art based on the embodiments of the present disclosure and without creative effort, shall all fall within the protective scope of the present disclosure.

The embodiments of the present disclosure is aimed at the technical problem that the existing OLED device has nonuniform brightness caused by that the brightness attenuation in the under-display area is slower than that in other areas with the increase of the viewing angle, and an OLED display panel and an OLED display device are provided for solving said technical problem.

Figure 1:
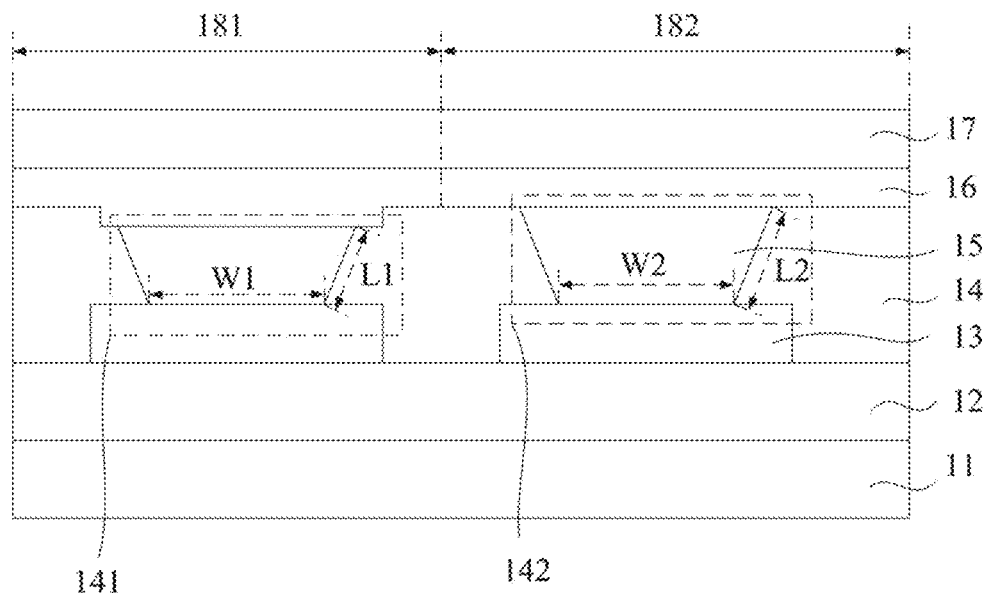
FIG. 1 is a first schematic diagram of an OLED display panel provided in embodiments of the present disclosure.

As shown in FIG. 1, an OLED display panel is provided in embodiments of the present disclosure, the OLED display panel includes a first display area 181 and a second display area 182, and the OLED display panel includes the following components:
A substrate 11.
A driving circuit layer 12 is disposed on a side of the substrate 11.
A pixel electrode layer 13 is disposed on a side of the driving circuit layer 12 away from the substrate 11.
A pixel definition layer 14 is disposed on a side of the pixel electrode layer 13 away from the driving circuit layer 12. A first pixel opening 141 in the first display area 181 and a second pixel opening 142 in the second display area 182 are formed by the pixel definition layer 14.
A light-emitting layer 15 is disposed on a side of the pixel definition layer 14 away from the pixel electrode layer 13.
A common electrode layer is disposed on a side of the light-emitting layer 15 away from the pixel definition layer 14.
A ratio W1/L1 of a width W1 of a side of the first pixel opening 141 adjacent to the pixel electrode layer 13 to a length L1 of a lateral surface of the first pixel opening 141 is greater than a ratio W2/L2 of a width W2 of a side of the second pixel opening 142 adjacent to the pixel electrode layer 13 to a length L2 of a lateral surface of the second pixel opening 142, i.e., W1/L1>W2/L2.

The embodiments of the present disclosure provide an OLED display panel, in which the ratio of the width of a side of the first pixel opening adjacent to the pixel electrode layer to the length of a lateral surface of the first pixel opening is greater than the ratio of the width of a side of the second pixel opening adjacent to the pixel electrode layer to the length of a lateral surface of the second pixel opening. That is, the rate of the brightness attenuation in the first display area caused by the increased viewing angle is enhanced, and/or the rate of the brightness attenuation in the second display area caused by the increased viewing angle is reduced, such that the brightness attenuations in the first and second display areas caused by the increased viewing angle are close or even the same, thereby improving or even eliminating the nonuniform brightness between the first display area and the second display area.

In one embodiment, the first display area is the area where electronic components are disposed, and the second display area is other display area. The position relationship between the first display area and the second display area is determined according to the arrangement manner of the electronic components. For example, if the electronic components are disposed in the display panel by digging holes, then the second display area is disposed around the first display area.

In one embodiment, the lateral surface of the first pixel opening refers to the plane or the curved surface around the first pixel opening, i.e., the surface which is not contact with the pixel electrode layer and the cathode layer. Taking FIG. 1 as an example, the lateral surface of the first pixel opening includes the plane with the length L1. The lateral surface of the second pixel opening refers to the plane or the curved surface around the second pixel opening, i.e., the surface which is not contact with the pixel electrode layer and the cathode layer. Taking FIG. 1 as an example, the lateral surface of the second pixel opening includes the plane with the length L2.

Figure 2:
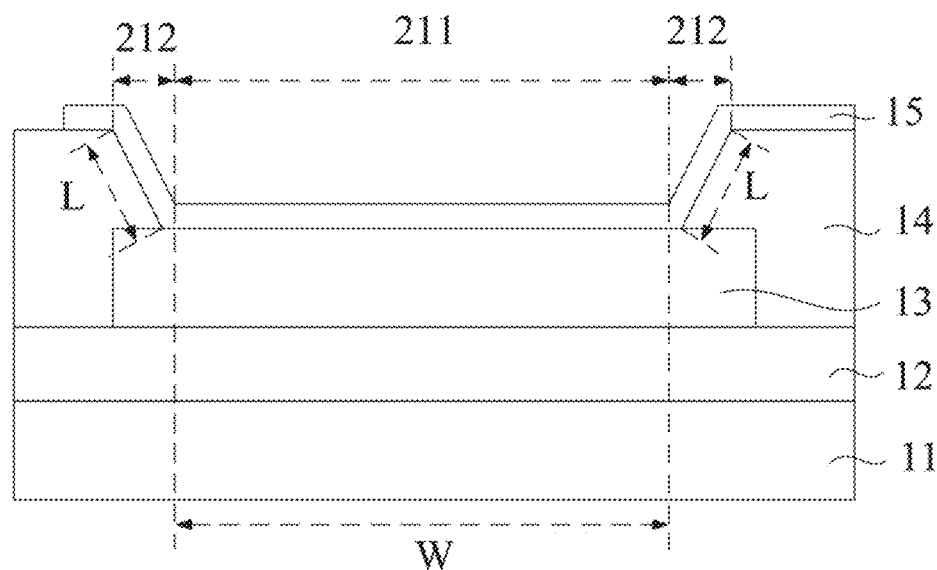
FIG. 2 is a second schematic diagram of an OLED display panel provided in embodiments of the present disclosure.
Figure 3:
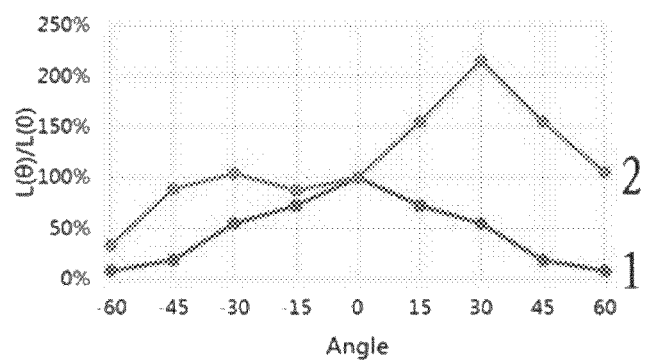
FIG. 3 is a broken line graph of brightness attenuations in different areas of the OLED display panel provided in embodiments of the present disclosure with the variation of the viewing angle.

As shown in FIG. 2, when the light-emitting layer 15 is disposed on the pixel opening formed by the pixel definition layer 14, the light-emitting layer 15 includes a portion located on the lateral surface area 212 of the pixel opening and a portion located on the area 211 of the pixel opening adjacent to the pixel electrode layer 13. By testing the brightness attenuations of the two areas with the increase of the viewing angle, the broken line graph as shown in FIG. 3 is obtained. In FIG. 3, the horizontal axis indicates angle (viewing angle) and the vertical axis indicates $L(\theta)/L(0)$, i.e., the vertical axis indicates the ratio of the brightness with the viewing angle of $\theta$ to the brightness with the viewing angle of 0. The curve 1 in FIG. 3 represents the broken line of the brightness in the area 211 with the variation of the viewing angle, and the curve 2 in FIG. 3 represents the broken line of the brightness in the area 212 with the variation of the viewing angle.

As can be seen from FIG. 3, with the variation of the viewing angle, the rate of the brightness attenuation in the lateral surface area of the pixel opening of the pixel definition layer is slower than the rate of the brightness attenuation in the area of the pixel opening adjacent to the pixel definition layer. Then, it can be seen that the rate of the brightness attenuation in the display area with the variation of the viewing angle can be adjusted by adjusting the rate of the brightness attenuation in the lateral surface area of the pixel opening of the pixel definition layer with the variation of the viewing angle and/or the rate of the brightness attenuation in the area of the pixel opening adjacent to the pixel definition layer with the variation of the viewing angle, such that the rates of the brightness attenuation in the under-display camera area and other areas with the variation of the viewing angle are close or even the same, which keeps the brightness uniformity of the OLED display panel.

Specifically, the rate of the brightness attenuation can be adjusted by adjusting the length L of the lateral surface of the pixel opening of the pixel definition layer and/or the width W of the side of the pixel opening of the pixel definition layer adjacent to the pixel electrode layer, that is, adjusting W/L.

Specifically, the greater the ratio of the length L of the lateral surface of the pixel opening of the pixel definition layer to the width W of the side of the pixel opening of the pixel definition layer adjacent to the pixel electrode layer is, the lower the rate of the brightness attenuation is. The smaller the ratio of the length L of the lateral surface of the pixel opening of the pixel definition layer to the width W of the side of the pixel opening of the pixel definition layer adjacent to the pixel electrode layer is, the higher the rate of the brightness attenuation is. By adjusting W/L, the brightness uniformity of the under-display camera area and other display area can be maintained.

In one embodiment, as shown in FIG. 1, the length L1 of the lateral surface of the first pixel opening 141 is smaller than the length L2 of the lateral surface of the second pixel opening 142, and the angle between the lateral surface of the first pixel opening 141 and one side of the first pixel opening 141 adjacent to the pixel electrode layer 13 is equal to the angle between the lateral surface of the second pixel opening 142 and one side of the second pixel opening 142 adjacent to the pixel electrode layer 13. When the rates of the brightness attenuation in the first display area and the second display area with the variation of the angle are adjusted, the length of the lateral surface of the first pixel opening is adjusted to be smaller than the length of the lateral surface of the second pixel opening, which increases the rate of the brightness attenuation in the first display area relative to that in the second display area, so that the rates the brightness attenuation in the first display area and the second display area with the variation of the angle are close or even the same.

Specifically, when making the length of the lateral surface of the first pixel opening smaller than the length of the lateral surface of the second pixel opening, the length of the lateral surface of the first pixel opening can be reduced to improve the brightness uniformity of the OLED display panel without increasing the thickness of the OLED display panel. Moreover, the length of the lateral surface of the second pixel opening can also be increased to adjust or maintain the thickness of other film layers correspondingly. The embodiments of the present disclosure are not limited thereto, as long as the length of the lateral surface of the first pixel opening is smaller than the length of the lateral surface of the second pixel opening.

In one embodiment, the angles of the first pixel opening in the first display area and the second pixel opening in the second display area can be kept the same, and the length of the lateral surfaces of the first pixel opening and the second pixel opening are adjusted to change the rate of the brightness attenuation of the OLED display panel with the variation of the angle, such that the brightness uniformity between the first display area and the second display area is maintained.

With regard to the pixel opening of the OLED display panel that is defined around the light-emitting layer, the rate of the brightness attenuation of the OLED display panel with the variation of the angle can be adjusted by designing each lateral surface. In one embodiment, each of the first pixel opening and the second pixel opening includes four lateral surfaces surrounding the light-emitting layer, and the length of any one of the lateral surfaces of the first pixel opening is smaller than the length of corresponding one of the lateral surfaces of the second pixel opening. By making the length of any one of the lateral surfaces of the first pixel opening smaller than the length of the corresponding one of the lateral surfaces of the second pixel opening, the rate of the brightness attenuation of each one of the lateral surfaces of the first pixel opening with the variation of the angle can be greater than the rate of the brightness attenuation of each one of the lateral surfaces of the second pixel opening with the variation of the angle. Therefore, when viewing the OLED display panel at each viewing angle, the rates of the brightness attenuation in the first display area and the second display area with the variation of the angle are close to or even the same, so that the brightness uniformity between the first display area and the second display area is maintained.

In one embodiment, when the lengths of the lateral surfaces of the first pixel opening and the second pixel opening are arranged, each one of the lateral surfaces of the first pixel opening can be reduced by the same length, or each one of the lateral surfaces of the second pixel opening can be increased by the same length. After changing the lengths of the lateral surfaces of the first pixel opening and/or the second pixel opening, the length of each one of the lateral surfaces of the first pixel opening and/or the second pixel opening is kept the same, so as to avoid that the length of each one of the lateral surfaces of the first pixel opening and/or the second pixel opening are different, which results in nonuniform display caused by nonuniform arrangement of the light-emitting layer. However, the embodiments of the present disclosure are not limited thereto.

In one embodiment, in consideration of viewing the OLED display panel in different directions, the attenuation rates along with the viewing angle in different directions are different. Therefore, by making the lengths of the lateral surfaces of the OLED display panel in different directions be different, the rates of the brightness attenuation along with the viewing angle in different directions are adjusted, so that the OLED display panels can maintain the brightness uniformity when viewing the OLED display panel in different directions.

The length of each one of the lateral surfaces of the first pixel opening being smaller than the length of each corresponding one of the lateral surfaces of the second pixel opening is described in detail in the aforementioned embodiments. In one embodiment, the rate of the brightness attenuation in the first pixel opening with the variation of the angle can be increased and/or the rate of the brightness attenuation in the second pixel opening with the variation of the angle can be decreased by making one of the lateral surfaces of the first pixel opening smaller than the lateral surface of the second pixel opening, so as to keep the brightness uniformity between the first display area and the second display area.

When designing the lateral surfaces of the first pixel opening and the second pixel opening, the rates of the brightness attenuation in the first display area and the second display area with the variation of the angle can also be changed by designing one side of the first pixel opening and one side of the second pixel opening which are adjacent to the pixel electrode layer. In one embodiment, as shown in FIG. 1, the width W1 of the side of the first pixel opening 141 adjacent to the pixel electrode layer 13 is greater than or equal to the width W2 of the side of the second pixel opening 142 adjacent to the pixel electrode layer 13.

When the width of the side of the first pixel opening adjacent to the pixel electrode layer and the width of the side of the second pixel opening adjacent to the pixel electrode layer are arranged, the greater the ratio of the width of the side of the pixel opening adjacent to the pixel electrode layer to the length of the lateral surface of the pixel opening, the higher the rate of the brightness attenuation in the area corresponding to the pixel opening with the variation of the angle. When making the length of the lateral surface of the first pixel opening smaller than the length of the lateral surface of the second pixel opening, the rate of the brightness attenuation in the corresponding area of the first pixel opening with the variation of the angle is further increased and/or the rate of the brightness attenuation in the corresponding area of the second pixel opening with the variation of the angle is further decreased by making the width of the side of the first pixel opening adjacent to the pixel electrode layer greater than or equal to the width of the side of the second pixel opening adjacent to the pixel electrode layer, so that the rates of the brightness attenuation in the corresponding areas of the first pixel opening and the second pixel opening with the variation of the angle are close or even the same.

When designing the length of the lateral surface of the first pixel opening and the width of the side of the first pixel opening adjacent to the pixel electrode layer, and/or the length of the lateral surface of the second pixel opening and the width of the side of the second pixel opening adjacent to the pixel electrode layer, by designing two dimensions, the large pixel difference between the first display area and the second display area caused by designing one dimension can be avoided.

In one embodiment, when the width of the side of the first pixel opening adjacent to the pixel electrode layer is equal to the width of the side of the second pixel opening adjacent to the pixel electrode layer, the size of the pixels of the OLED display panel may be unchanged. That is, the length of the lateral surface of the pixel definition layer in the first display area and/or the second display area can be changed to avoid affecting the resolution of OLED display panel. When the width of the side of the first pixel opening adjacent to the pixel electrode layer is greater than the width of the side of the second pixel opening adjacent to the pixel electrode layer, the rates of the brightness attenuation in first display area and the second display area with the variation of the angle can be further consistent by adjusting the size of the two dimensions.

In one embodiment, the width of the side of the first pixel opening adjacent to the pixel electrode layer is smaller than the width of the side of the second pixel opening adjacent to the pixel electrode layer. By making the width of the side of the first pixel opening adjacent to the pixel electrode layer smaller than the width of the side of the second pixel opening adjacent to the pixel electrode layer, the ratio of the width of the side of the first pixel opening adjacent to the pixel electrode layer to the length of the lateral surface of the first pixel opening is greater than the ratio of the width of the side of the second pixel opening adjacent to the pixel electrode layer to the length of the lateral surface of the second pixel opening, and thus the difference between the rates of the brightness attenuation in the first display area and the second display area with the variation of the angle can be reduced, and the size of the pixels in the first display area can be reduced to enhance the resolution.

When the length of the lateral surface of the first pixel opening and/or the second pixel opening is changed, the film of the pixel definition layer tends to be uneven. In one embodiment, the OLED display panel further includes a packaging layer, and the thickness of the packaging layer on the first pixel opening is greater than the thickness of the packaging layer on the second pixel opening. In other words, by adjusting the thicknesses of the packaging layer in different areas, the thicknesses of the first display area and the second display area of the OLED display panel are consistent, which facilitates the formation of subsequent film or components.

The thickness of the packaging layer is described in detail in the aforementioned embodiments. In one embodiment, as shown in FIG. 1, the thickness of the common electrode layer 16 on the first pixel opening 141 is greater than the thickness of the common electrode layer 16 on the second pixel opening 142. In other words, by adjusting the thickness of the cathode, the thickness of the first display area and the thickness of the second display area are the same. Moreover, the increase of the thickness of the cathode can reduce the impedance of the cathode and improve the display effect, but the embodiments of the present disclosure are not limited thereto. In consideration of compensating the voltage of the OLED display panel, in order to avoid the difficulty in determining the compensated voltage due to the different impedances in different areas, the thickness of the cathodes in different areas can be kept the same, and the thickness of the OLED display panel can be kept the same by adjusting the thickness of other film layers.

For the problem of nonuniform display caused by different rates of the brightness attenuation in the first display area and the second display area with the variation of the angle, the design of the lateral surfaces of the first pixel opening the second pixel opening is described in detail in the aforementioned embodiments. In one embodiment, the length of the lateral surface of the first pixel opening is equal to the length of the lateral surface of the second pixel opening, and the width of the side of the first pixel opening adjacent to the pixel electrode layer is greater than the width of the side of the second pixel opening adjacent to the pixel electrode layer. In other words, the width of the side of the first pixel opening adjacent to the pixel electrode layer and/or the width of the side of the second pixel opening adjacent to the pixel electrode layer is designed without changing the lengths of the later surfaces of the first pixel opening and the second pixel opening to increase the rate of the brightness attenuation in the first display area with the variation of the angle and/or decrease the rate of the brightness attenuation in the second display area with the variation of the angle, so that the rates of the brightness attenuation in the first display area and the second display area with the variation of the angle are close or even consistent.

Specifically, when making the width of the side of the first pixel opening adjacent to the pixel electrode layer is greater than the width of the side of the second pixel opening adjacent to the pixel electrode layer, the width of the side of the first pixel opening adjacent to the pixel electrode layer can be increased to heighten the rate of the brightness attenuation in the first display area with the variation of the angle. Moreover, the width of the side of the second pixel opening adjacent to the pixel electrode layer can also be decreased to lower the rate of the brightness attenuation in the second display area with the variation of the angle. Therefore, when the brightness uniformity of the OLED display panel is improved, the rate of the brightness attenuation of the OLED display panel with the variation of the angle is reduced and the resolution of the OLED display panel is also enhanced. Furthermore, both can be adjusted to make the rates of the brightness attenuation in the first display area and the second display area with the variation of the angle close or even consistent, so as to improve the brightness uniformity of the OLED display panel.

In one embodiment, the length of the lateral surface of the first pixel opening is greater than the length of the lateral surface of the second pixel opening, and the width of the side of the first pixel opening adjacent to the pixel electrode layer is greater than the width of the side of the second pixel opening adjacent to the pixel electrode layer. When designing the first pixel opening and the second pixel opening, the length of the lateral surface of the first pixel opening can also be greater than the length of the lateral surface of the second pixel opening and the width of the side of the first pixel opening adjacent to the pixel electrode layer can also be greater than the width of the side of the second pixel opening adjacent to the pixel electrode layer, such that the rates of the brightness attenuation in the first display area and the second display area with the variation of the angle are close or even the same, thereby improving the brightness uniformity of the OLED display panel.

In one embodiment, the ratio of the width of the side of the first pixel opening adjacent to the pixel electrode layer to the length of the lateral surface of the first pixel opening is ranged from 1.1 to 4 times of the ratio of the width of the side of the second pixel opening adjacent to the pixel electrode layer to the length of the lateral surface of the second pixel opening. When adjusting the ratio of the width of the side of the first pixel opening adjacent to the pixel electrode layer to the length of the lateral surface of the first pixel opening and/or the ratio of the width of the side of the second pixel opening adjacent to the pixel electrode layer to the length of the lateral surface of the second pixel opening, the brightness uniformity of the OLED display panel can be improved by controlling the ratio of the former ratio to the latter ratio to be 1.1 to 4.

Figure 4:
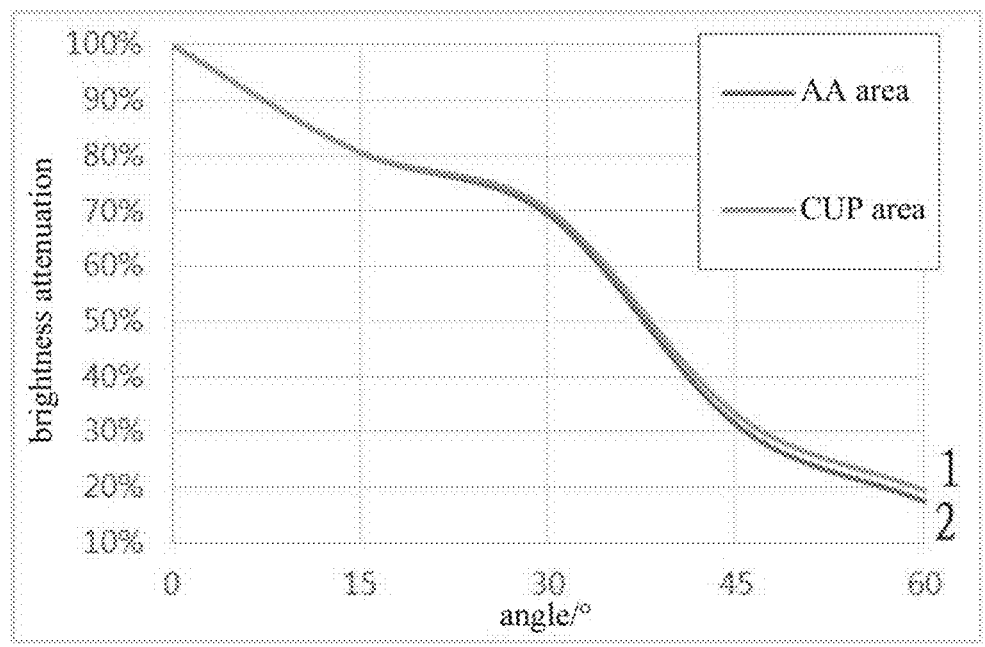
FIG. 4 is a graph of brightness attenuations in different areas of the existing OLED display panel with the variation of the viewing angle.

As shown in FIG. 4, the horizontal axis indicates angle, i.e., the viewing angle, and the unit thereof is degree (°). The vertical axis indicates brightness attenuation. The curve 1 is the curve of the brightness attenuation in CUP area (under-display camera area) with the variation of the angle, and the curve 2 is the curve of the brightness attenuation in AA area (other display area) with the variation of the angle. From the curve 1 and the curve 2, it can be seen that with the increase of the angle, the difference of the brightness attenuation between the under-display camera area and other display area becomes larger, and the rate of the brightness attenuation in the under-display camera area with the variation of the angle is relatively low.

Figure 5:
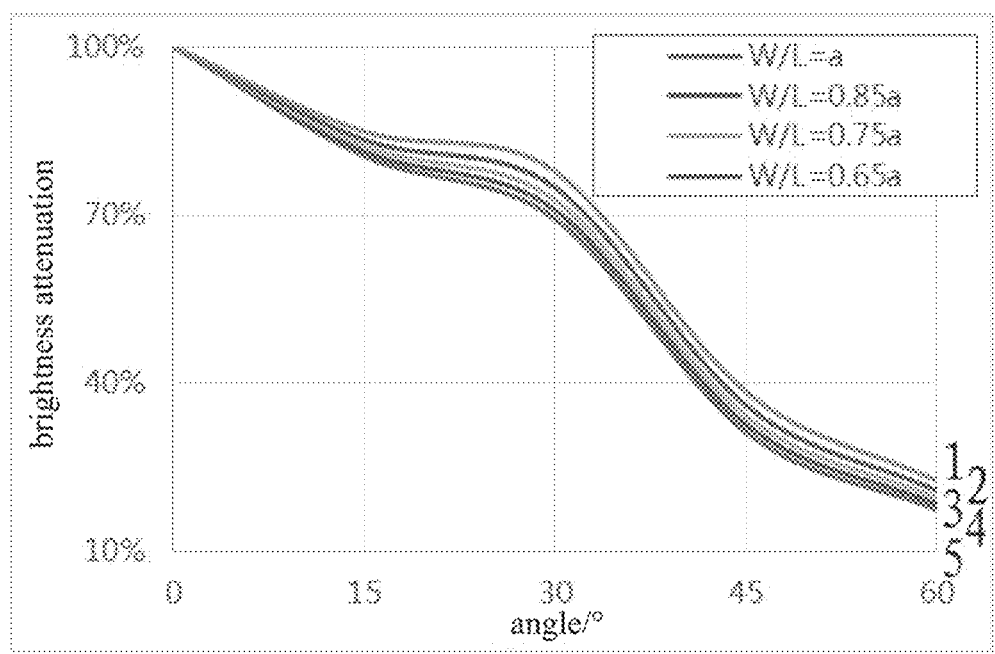
FIG. 5 is a first graph of brightness attenuations in different areas of the OLED display panel provided in embodiments of the present disclosure with the variation of the viewing angle.

As shown in FIG. 5, the horizontal axis indicates angle, i.e., the viewing angle, and the unit thereof is degree (°). The vertical axis indicates brightness attenuation. Taking the structure of the OLED display panel shown in FIG. 2 as an example, the curve 1 is the curve of the brightness attenuation of W/L=0.55a in a certain area of the LOED display panel with the variation of the angle. The curve 2 is the curve of the brightness attenuation of W/L=0.65a in a certain area of the LOED display panel with the variation of the angle. The curve 3 is the curve of the brightness attenuation of W/L=0.75a in a certain area of the LOED display panel with the variation of the angle. The curve 4 is the curve of the brightness attenuation of W/L=0.85a in a certain area of the LOED display panel with the variation of the angle. The curve 4 is the curve of the brightness attenuation of W/L=a in a certain area of the LOED display panel with the variation of the angle. From each curve in FIG. 5, it can be seen that the rates of the brightness attenuation with the variation of the angle are reduced with the decrease of the value of W/L.

Figure 6:
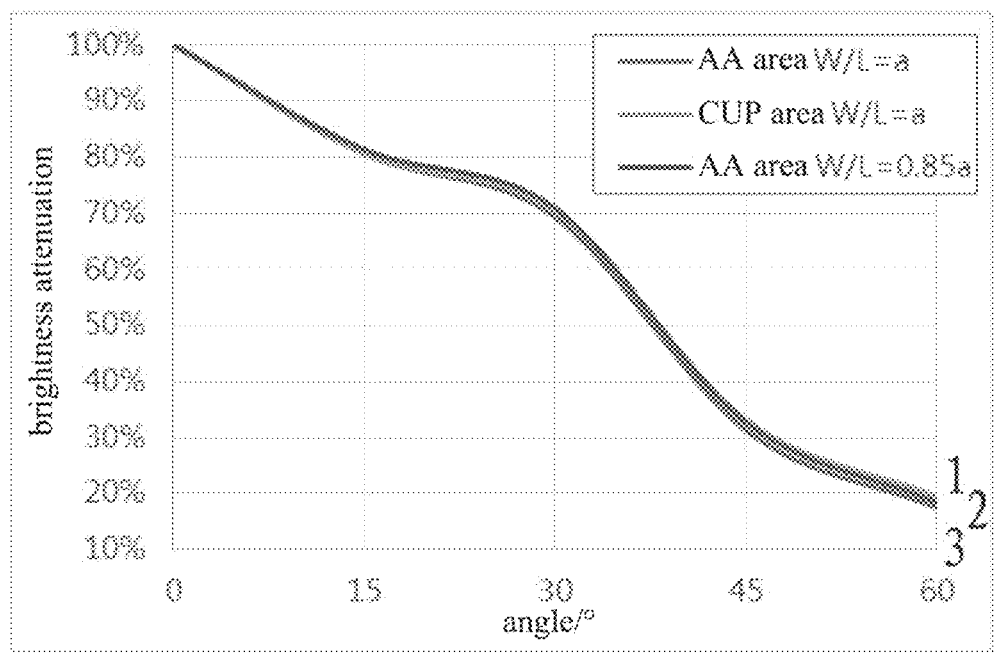
FIG. 6 is a second graph of brightness attenuations in different areas of the OLED display panel provided in embodiments of the present disclosure with the variation of the viewing angle.

In the embodiments of the present disclosure, according to the aforementioned study, the value of W/L of the under-display are and/or other display areas is designed to maintain the uniformity of the display brightness between the first display area and the second display area of the OLED display panel. For example, as shown in FIG. 6, the horizontal axis indicates angle, i.e., the viewing angle, and the unit thereof is degree (°). The vertical axis indicates brightness attenuation. The curve 1 is the curve of the brightness attenuation of W/L=a in CUP area (under-display camera area) with the variation of the angle. The curve 2 is the curve of the brightness attenuation of W/L=0.85a in AA area (other display areas) with the variation of the angle. The curve 3 is the curve of the brightness attenuation of W/L=a in AA area (other display area) with the variation of the angle. It can be seen from FIG. 6 that the brightness attenuations in the under-display camera area and other display areas with the variation of the angle are close or even the same after reducing the value of W/L of other display area, thereby solving the problem of nonuniform brightness in different areas of the OLED display panel.

The value of "a" is set according to the demand.

Figure 7:
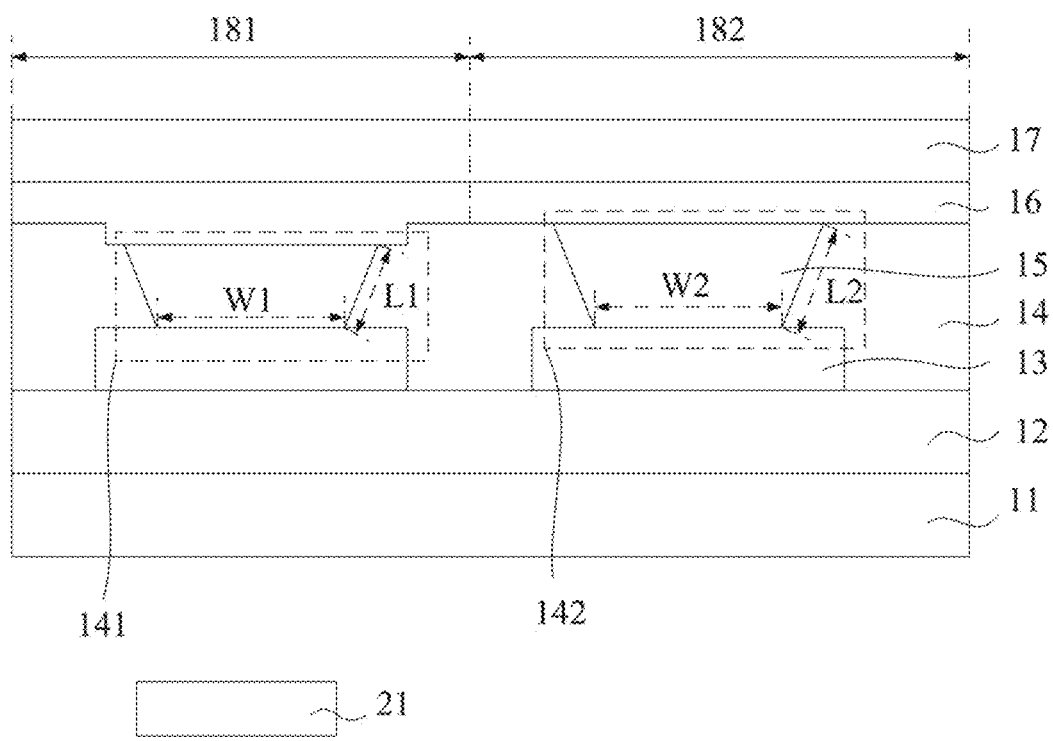
FIG. 7 is a schematic diagram of an OLED display device provided in embodiments of the present disclosure.

Moreover, as shown in FIG. 7, an OLED display device is provided in the embodiments of the present disclosure, which includes the following components.

An OLED display panel includes a first display area 181 and a second display area 182. The OLED display panel includes a substrate 11, a driving circuit layer 12, a pixel electrode layer 13, a pixel definition layer 14, a light-emitting layer 15, and a common electrode layer 16. The driving circuit layer 12 is disposed on a side of the substrate 11. The pixel electrode layer 13 is disposed on a side of the driving circuit layer 12 away from the substrate 11. The pixel definition layer 14 is disposed on a side of the pixel electrode layer 13 away from the driving circuit layer 12. A first pixel opening 141 in the first display area 181 and a second pixel opening 142 in the second display area 182 are formed by the pixel definition layer 14. The light-emitting layer 15 is disposed on a side of the pixel definition layer 14 away from the pixel electrode layer 13. The common electrode layer 16 is disposed on a side of the light-emitting layer 15 away from the pixel definition layer 14. A ratio W1/L1 of a width W1 of a side of the first pixel opening 141 adjacent to the pixel electrode layer 13 to a length L1 of a lateral surface of the first pixel opening 141 is greater than a ratio W2/L2 of a width W2 of a side of the second pixel opening 142 adjacent to the pixel electrode layer 13 to a length L2 of a lateral surface of the second pixel opening 142, that is, W1/L1>W2/L2.

An electronic element 21 is disposed in the first display area 181.

An OLED display device is provided in the embodiments of the present disclosure, the OLED display device includes an OLED display panel and an electronic element. For the OLED display panel, the ratio of the width of a side of the first pixel opening adjacent to the pixel electrode layer to the length of a lateral surface of the first pixel opening is greater than the ratio of the width of a side of the second pixel opening adjacent to the pixel electrode layer to the length of a lateral surface of the second pixel opening, that is, the rate of the brightness attenuation in the first display area caused by the increased viewing angle is enhanced, and/or the rate of the brightness attenuation in the second display area caused by the increased viewing angle is reduced, such that the brightness attenuations in the first and second display areas caused by the increased viewing angle are close or even the same, thereby improving or even eliminating the nonuniform brightness between the under-display camera area and other display area.

In one embodiment, the position where the electronic element is disposed is based on the different designs of OLED display devices. For example, if a light-receiving area of the electronic element corresponds to the area between the sub-pixels of the OLED display panel, then the light-receiving area of the electronic element is correspondingly disposed in the area between the sub-pixels of the OLED display panel. The combination manner of the electronic element and the OLED display panel is set according to the demand, and the embodiment of the present disclosure is not limited thereto.

In one embodiment, the electronic element includes an under-display camera.

In one embodiment, in the OLED display device, the length of the lateral surface of the first pixel opening is smaller than the length of the lateral surface of the second pixel opening, and an angle between the lateral surface of the first pixel opening and the side of the first pixel opening adjacent to the pixel electrode layer is equal to an angle between the lateral surface of the second pixel opening and the side of the second pixel opening adjacent to the pixel electrode layer.

In one embodiment, in the OLED display device, each of the first pixel opening and the second pixel opening includes four lateral surfaces surrounding the light-emitting layer, and a length of any one of the lateral surfaces of the first pixel opening is smaller than a length of corresponding one of the lateral surfaces of the second pixel opening.

In one embodiment, in the OLED display device, the width of the side of the first pixel opening adjacent to the pixel electrode layer is greater than or equal to the width of the side of the second pixel opening adjacent to the pixel electrode layer.

In one embodiment, in the OLED display device, the width of the side of the first pixel opening adjacent the pixel electrode layer is smaller than the width of the side of the second pixel opening adjacent to the pixel electrode layer.

In one embodiment, in the OLED display device, the OLED display panel further includes a packaging layer, and a thickness of the packaging layer located on the first pixel opening is greater than a thickness of the packaging layer located on the second pixel opening.

In one embodiment, a thickness of the common electrode layer located on the first pixel opening is greater than a thickness of the common electrode layer located on the second pixel opening.

In one embodiment, in the OLED display device, the length of the lateral surface of the first pixel opening is equal to the length of the lateral surface of the second pixel opening, and the width of the side of the first pixel opening adjacent to the pixel electrode layer is greater than the width of the side of the second pixel opening adjacent to the pixel electrode layer.

In one embodiment, in the OLED display device, the length of the lateral surface of the first pixel opening is greater than the length of the lateral surface of the second pixel opening, and the width of the side of the first pixel opening adjacent the pixel electrode layer is greater than the width of the side of the second pixel opening adjacent to the pixel electrode layer.

In one embodiment, in the OLED display device, the ratio of the width of the side of the first pixel opening adjacent to the pixel electrode layer to the length of the lateral surface of the first pixel opening is 1.1 to 4 times of the ratio of the width of the side of the second pixel opening adjacent the pixel electrode layer to the length of the lateral surface of the second pixel opening.

According to the aforementioned embodiments, it can be seen that:

An OLED display panel and an OLED display device are disclosed in the embodiments of the present disclosure. The OLED display panel includes a first display area and a second display area. The OLED display panel includes a substrate, a driving circuit layer, a pixel electrode layer, a pixel definition layer, a light-emitting layer, and a common electrode layer. The driving circuit layer is disposed on a side of the substrate. The pixel electrode layer is disposed on a side of the driving circuit layer away from the substrate. The pixel definition layer is disposed on a side of the pixel electrode layer away from the driving circuit layer. A first pixel opening in the first display area and a second pixel opening in the second display area are formed by the pixel definition layer. The light-emitting layer is disposed on a side of the pixel definition layer away from the pixel electrode layer. The common electrode layer is disposed on a side of the light-emitting layer away from the pixel definition layer. A ratio of a width of a side of the first pixel opening adjacent to the pixel electrode layer to a length of a lateral surface of the first pixel opening is greater than a ratio of a width of a side of the second pixel opening adjacent to the pixel electrode layer to a length of a lateral surface of the second pixel opening. In other words, the rate of the brightness attenuation in the first display area caused by the increased viewing angle is enhanced, and/or the rate of the brightness attenuation in the second display area caused by the increased viewing angle is reduced, such that the brightness attenuations in the first and second display areas caused by the increased viewing angle are close or even the same, thereby improving or even eliminating the nonuniform brightness between the first display area and the second display area.

In the aforementioned embodiments, the description of each embodiment has its emphasis. The part not detailed in one embodiment may refer to the related description of other embodiments.

An OLED display panel and an OLED display device provided in the embodiments of the present disclosure are described in detail. The specification describes the principles and the implementations of the present disclosure using specific examples. The descriptions of the foregoing embodiments are merely used to help understanding of the methods and core concepts of the present disclosure. One of ordinary skill in the art should understand that modifications may be made to the technical solutions disclosed in aforementioned embodiments or substitutions may be made for some technical features therein, and these modifications or substitutions shall not make the spirit of the corresponding technical solutions depart from scope of the technical solutions in the embodiments of the present disclosure.

What is claimed is:

1. An OLED display panel comprising a first display area and a second display area, wherein the OLED display panel comprises:
   a substrate;
   a driving circuit layer disposed on a side of the substrate;
   a pixel electrode layer disposed on a side of the driving circuit layer away from the substrate;
   a pixel definition layer disposed on a side of the pixel electrode layer away from the driving circuit layer, wherein a first pixel opening in the first display area and a second pixel opening in the second display area are formed by the pixel definition layer;
   a light-emitting layer disposed on a side of the pixel definition layer away from the pixel electrode layer;
   a common electrode layer disposed on a side of the light-emitting layer away from the pixel definition layer;
   wherein a ratio of a width of a side of the first pixel opening adjacent to the pixel electrode layer to a length of a lateral surface of the first pixel opening is greater than a ratio of a width of a side of the second pixel opening adjacent to the pixel electrode layer to a length of a lateral surface of the second pixel opening.

2. The OLED display panel according to claim 1, wherein the length of the lateral surface of the first pixel opening is smaller than the length of the lateral surface of the second pixel opening, and an angle between the lateral surface of the first pixel opening and the side of the first pixel opening adjacent to the pixel electrode layer is equal to an angle between the lateral surface of the second pixel opening and the side of the second pixel opening adjacent to the pixel electrode layer.

3. The OLED display panel according to claim 2, wherein each of the first pixel opening and the second pixel opening comprises four lateral surfaces surrounding the light-emitting layer, and a length of any one of the lateral surfaces of the first pixel opening is smaller than a length of corresponding one of the lateral surfaces of the second pixel opening.

4. The OLED display panel according to claim 2, wherein the width of the side of the first pixel opening adjacent to the pixel electrode layer is greater than or equal to the width of the side of the second pixel opening adjacent to the pixel electrode layer.

5. The OLED display panel according to claim 2, wherein the width of the side of the first pixel opening adjacent to the pixel electrode layer is smaller than the width of the side of the second pixel opening adjacent to the pixel electrode layer.

6. The OLED display panel according to claim 2, wherein the OLED display panel further comprises a packaging layer, and a thickness of the packaging layer located on the first pixel opening is greater than a thickness of the packaging layer located on the second pixel opening.

7. The OLED display panel according to claim 1, wherein the length of the lateral surface of the first pixel opening is equal to the length of the lateral surface of the second pixel opening, and the width of the side of the first pixel opening adjacent to the pixel electrode layer is greater than the width of the side of the second pixel opening adjacent to the pixel electrode layer.

8. The OLED display panel according to claim 1, wherein the length of the lateral surface of the first pixel opening is greater than the length of the lateral surface of the second pixel opening, and the width of the side of the first pixel opening adjacent to the pixel electrode layer is greater than the width of the side of the second pixel opening adjacent to the pixel electrode layer.

9. The OLED display panel according to claim 1, wherein the ratio of the width of the side of the first pixel opening adjacent to the pixel electrode layer to the length of the lateral surface of the first pixel opening is 1.1 to 4 times of the ratio of the width of the side of the second pixel opening adjacent to the pixel electrode layer to the length of the lateral surface of the second pixel opening.

10. An OLED display device, comprising:
an OLED display panel comprising a first display area and a second display area, wherein the OLED display panel comprises a substrate, a driving circuit layer, a pixel electrode layer, a pixel definition layer, a light-emitting layer, and a common electrode layer, the driving circuit layer is disposed on a side of the substrate, the pixel electrode layer is disposed on a side of the driving circuit layer away from the substrate, the pixel definition layer is disposed on a side of the pixel electrode layer away from the driving circuit layer, a first pixel opening in the first display area and a second pixel opening in the second display area are formed by the pixel definition layer, the light-emitting layer is disposed on a side of the pixel definition layer away from the pixel electrode layer, the common electrode layer is disposed on a side of the light-emitting layer away from the pixel definition layer, wherein a ratio of a width of a side of the first pixel opening adjacent to the pixel electrode layer to a length of a lateral surface of the first pixel opening is greater than a ratio of a width of a side of the second pixel opening adjacent to the pixel electrode layer to a length of a lateral surface of the second pixel opening; and
an electronic element disposed in the first display area.

11. The OLED display device according to claim 10, wherein the electronic component comprises an under-display camera.

12. The OLED display device according to claim 10, wherein the length of the lateral surface of the first pixel opening is smaller than the length of the lateral surface of the second pixel opening, and an angle between the side surface of the first pixel opening and the side of the first pixel opening adjacent to the pixel electrode layer is equal to an angle between the side surface of the second pixel opening and the side of the second pixel opening adjacent to the pixel electrode layer.

13. The OLED display device according to claim 12, wherein each of the first pixel opening and the second pixel opening comprises four lateral surfaces surrounding the light-emitting layer, and a length of any one of the lateral surfaces of the first pixel opening is smaller than a length of corresponding one of the lateral surfaces of the second pixel opening.

14. The OLED display device according to claim 12, wherein the width of the side of the first pixel opening adjacent to the pixel electrode layer is greater than or equal to the width of the side of the second pixel opening adjacent to the pixel electrode layer.

15. The OLED display device according to claim 12, wherein the width of the side of the first pixel opening adjacent to the pixel electrode layer is smaller than the width of the side of the second pixel opening adjacent to the pixel electrode layer.

16. The OLED display device according to claim 12, wherein the OLED display panel further comprises a packaging layer, and a thickness of the packaging layer located on the first pixel opening is greater than a thickness of the packaging layer located on the second pixel opening.

17. The OLED display device according to claim 10, wherein a thickness of the common electrode layer located on the first pixel opening is greater than a thickness of the common electrode layer located on the second pixel opening.

18. The OLED display device according to claim 10, wherein the length of the lateral surface of the first pixel opening is equal to the length of the lateral surface of the second pixel opening, and the width of the side of the first pixel opening adjacent to the pixel electrode layer is greater than the width of the second pixel opening adjacent to the pixel electrode layer.

19. The OLED display device according to claim 10, wherein the length of the lateral surface of the first pixel opening is greater than the length of the lateral surface of the second pixel opening, and the width of the side of the first pixel opening adjacent to the pixel electrode layer is greater than the width of the side of the second pixel opening adjacent to the pixel electrode layer.

20. The OLED display device according to claim 10, wherein the ratio of the width of the side of the first pixel opening adjacent to the pixel electrode layer to the length of the lateral surface of the first pixel opening is 1.1 to 4 times of the ratio of the width of the side of the second pixel opening adjacent to the pixel electrode layer to the length of the lateral surface of the second pixel opening.

\* \* \* \* \*